(12) United States Patent
Derderian et al.

(10) Patent No.: US 7,217,615 B1
(45) Date of Patent: May 15, 2007

(54) CAPACITOR FABRICATION METHODS INCLUDING FORMING A CONDUCTIVE LAYER

(75) Inventors: Garo J. Derderian, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/653,149

(22) Filed: Aug. 31, 2000

(51) Int. Cl.
*H01L 21/8242* (2006.01)

(52) U.S. Cl. .................. 438/239; 438/243; 257/303; 257/E27.048

(58) Field of Classification Search ............... 438/239, 438/243; 257/301, 303, E27.048, E27.092
See application file for complete search history.

(56) References Cited

U.S. PATENT DOCUMENTS

| | | |
|---|---|---|
| 5,006,956 A | 4/1991 | Kawakita et al. |
| 5,126,283 A | 6/1992 | Pintchovski et al. |
| 5,316,982 A | 5/1994 | Taniguchi |
| 5,432,732 A | 7/1995 | Ohmi |
| 5,452,178 A | 9/1995 | Emesh et al. |
| 5,625,233 A | 4/1997 | Cabral, Jr. et al. |
| 5,641,984 A | 6/1997 | Aftergut et al. |
| 5,774,327 A | 6/1998 | Park |
| 5,811,344 A | 9/1998 | Tu et al. |
| 5,885,882 A | 3/1999 | Schugraf et al. |

(Continued)

FOREIGN PATENT DOCUMENTS

| | | |
|---|---|---|
| EP | 1 508 908 A2 | 2/2005 |
| JP | 2002/222934 A | 8/2002 |
| KR | 2002046433 | 5/2003 |

OTHER PUBLICATIONS

U.S. patent application Ser. No. 09/141,840, Marsh, filed Nov. 12, 2001.
U.S. patent application Ser. No. 09/652,532, Derderian, filed Aug. 31, 2000.
U.S. patent application Ser. No. 09/653,156, Agarwal, filed Aug. 31, 2000.
A.W. Ott, et al., "Atomic layer controlled deposition of $Al_2O_3$ films using binary reaction sequence chemistry" Applied Surface Science (107) 1996, pps. 128–136.

(Continued)

*Primary Examiner*—Thao P Le
(74) *Attorney, Agent, or Firm*—Wells St. John P.S.

(57) ABSTRACT

A capacitor fabrication method may include atomic layer depositing a conductive barrier layer to oxygen diffusion over the first electrode. A method may instead include chemisorbing a layer of a first precursor at least one monolayer thick over the first electrode and chemisorbing a layer of a second precursor at least one monolayer thick on the first precursor layer, a chemisorption product of the first and second precursor layers being comprised by a layer of a conductive barrier material. The barrier layer may be sufficiently thick and dense to reduce oxidation of the first electrode by oxygen diffusion from over the barrier layer. An alternative method may include forming a first capacitor electrode over a substrate, the first electrode having an inner surface area per unit area and an outer surface area per unit area that are both greater than an outer surface area per unit area of the substrate. A capacitor dielectric layer and a second capacitor electrode may be formed over the dielectric layer. The method may further include forming rugged polysilicon over the substrate, the first electrode being over the rugged polysilicon. Accordingly, the outer surface area of the first electrode can be at least 30% greater than the outer surface area of the substrate without the first electrode including polysilicon.

51 Claims, 5 Drawing Sheets

U.S. PATENT DOCUMENTS

| | | | |
|---|---|---|---|
| 5,908,947 A | 6/1999 | Vaartstra | |
| 6,018,065 A | 1/2000 | Baum | |
| 6,033,967 A | 3/2000 | Li et al. | |
| 6,069,053 A | 5/2000 | Ping et al. | |
| 6,104,049 A * | 8/2000 | Solayappan et al. | 257/295 |
| 6,124,158 A | 9/2000 | Dautartas et al. | |
| 6,144,060 A | 11/2000 | Park et al. | |
| 6,156,606 A | 12/2000 | Michaelis | |
| 6,162,712 A | 12/2000 | Baum | |
| 6,174,770 B1 | 1/2001 | Chi | |
| 6,180,447 B1 * | 1/2001 | Park et al. | 438/240 |
| 6,180,481 B1 * | 1/2001 | Deboer et al. | 438/396 |
| 6,204,172 B1 | 3/2001 | Marsh | |
| 6,207,487 B1 * | 3/2001 | Kim et al. | 438/238 |
| 6,207,561 B1 | 3/2001 | Hwang et al. | |
| 6,218,256 B1 * | 4/2001 | Agarwal | 438/393 |
| 6,218,260 B1 | 4/2001 | Lee et al. | |
| 6,222,722 B1 * | 4/2001 | Fukuzumi et al. | 361/305 |
| 6,242,299 B1 | 6/2001 | Hickert | |
| 6,249,056 B1 | 6/2001 | Kwon | |
| 6,270,572 B1 | 8/2001 | Kim et al. | |
| 6,274,428 B1 | 8/2001 | Wu | |
| 6,281,142 B1 | 8/2001 | Basceri et al. | |
| 6,281,543 B1 | 8/2001 | Al-Shareef et al. | |
| 6,291,289 B2 | 9/2001 | Rhodes | |
| 6,307,730 B1 | 10/2001 | Yamanishi | |
| 6,309,923 B1 | 10/2001 | Tseng | |
| 6,335,240 B1 | 1/2002 | Kim et al. | |
| 6,355,519 B1 | 3/2002 | Lee | |
| 6,359,295 B1 | 3/2002 | Lee et al. | |
| 6,403,156 B2 | 6/2002 | Jang et al. | |
| 6,451,650 B1 | 9/2002 | Lou | |
| 6,458,416 B1 | 10/2002 | Derderian et al. | |
| 6,482,740 B2 | 11/2002 | Soininen et al. | |
| 6,780,704 B1 | 4/2003 | Sneh et al. | |
| 6,548,424 B2 | 5/2003 | Putkonen | |
| 6,596,583 B2 | 7/2003 | Agarwal et al. | |
| 6,596,602 B2 | 7/2003 | Iizuka et al. | |
| 6,627,462 B1 | 9/2003 | Yang et al. | |
| 6,632,279 B1 | 10/2003 | Ritala | |
| 6,684,186 B2 | 12/2003 | Callegari et al. | |
| 6,709,919 B2 | 3/2004 | Tu | |
| 6,730,163 B2 | 5/2004 | Vaartstra | |
| 6,746,930 B2 | 6/2004 | Yang | |
| 6,551,399 B1 | 8/2004 | Raaijmakers et al. | |
| 6,800,892 B2 | 10/2004 | Bhattacharyya | |
| 6,809,212 B2 | 10/2004 | Meiere et al. | |
| 6,824,816 B2 | 11/2004 | Aaltonen et al. | |
| 6,849,505 B2 | 2/2005 | Lee et al. | |
| 6,881,260 B2 | 4/2005 | Marsh et al. | |
| 6,946,342 B2 | 9/2005 | Yeo et al. | |
| 7,018,469 B2 | 3/2006 | Li et al. | |
| 2001/0024387 A1 * | 9/2001 | Raaijmakers et al. | 365/200 |
| 2002/0109198 A1 | 8/2002 | Yang et al. | |
| 2002/0142488 A1 | 10/2002 | Hong | |
| 2002/0153579 A1 | 10/2002 | Yamamoto | |
| 2002/0182820 A1 | 12/2002 | Choi et al. | |
| 2002/0197744 A1 | 12/2002 | Lee | |
| 2003/0215960 A1 | 11/2003 | Mitsuhashi | |
| 2004/0018747 A1 | 1/2004 | Lee et al. | |
| 2004/0125541 A1 | 7/2004 | Chung | |
| 2005/0018381 A1 | 1/2005 | McClure | |
| 2005/0082593 A1 | 4/2005 | Lee et al. | |

OTHER PUBLICATIONS

Ritala et al, "Perfectly Conformal TiN and Al2O3 Films Deposited by Atomic Layer Deposition," Chemical Vapor Deposition, v. 5, No. 1, 1999, pp. 7–9.

Suntola, "Surface Chemistry of Materials Deposition at Atomic Layer Level," Applied Surface Science, vol. 100/101, Mar. 1996, pp. 391–398.

T. Suntola, Atomic Layer Epitaxy, Handbook of Crystal Growth, vol. 3, 1994, pp. 603–663.

Leskela and Ritala, ALD Precursor Chemistry: Evolution and Future Challenges, J. Phys. IV France 9 (1999), pp. 837–852.

U.S. Appl. No. 09/590,795, Agarwal et al.

U.S. Appl. No. 09/651,156, Agarwal.

* cited by examiner

CAPACITOR FABRICATION METHODS INCLUDING FORMING A CONDUCTIVE LAYER

TECHNICAL FIELD

The aspects of the invention relate to capacitor fabrication methods including forming conductive barrier layers and capacitor constructions having conductive barrier layers.

BACKGROUND OF THE INVENTION

Capacitors are common devices used in electronics, such as integrated circuits, and particularly semiconductor-based technologies. Two common capacitor structures include metal-insulator-metal (MIM) capacitors and metal-insulator-semiconductor (MIS) capacitors. One important factor to consider when selecting a capacitor structure may be the capacitance per unit area. MIS capacitors may be advantageous since a first electrode as the semiconductor may be formed of hemispherical grain (HSG) polysilicon that exhibits a higher surface area in a given region compared to a planar surface of amorphous silicon. The higher surface area provides more capacitance per unit area occupied by a capacitor.

However, a high K factor (also known as dielectric constant or "κ") dielectric material may be desirable to further enhance capacitance. $Ta_2O_5$ is one example of a high K factor dielectric, but it inherently forms an interfacial dielectric layer of $SiO_2$ when formed on a capacitor electrode comprising HSG. The interfacial dielectric exhibits a lower K factor than $Ta_2O_5$ an us reduces the effective dielectric constant for the capacitor construction. Such reduction may be significant enough to eliminate any gain in capacitance per unit area otherwise achieved by using HSG instead of a planar electrode. Use of other oxygen containing high K dielectric materials has proved to create similar problems.

Because it may be desirable to provide area enhancement of an electrode in a MIM structure using HSG, one attempt at addressing the stated problem is forming a silicon nitride insulative barrier layer over the HSG. The silicon nitride barrier layer may be formed by nitridizing the silicon of the outer surface of HSG. Unfortunately, silicon nitride exhibits a K factor of only about 7, less than the K factor of some high K factor dielectrics that are desirable. Accordingly, even the silicon nitride barrier layer reduces the effective dielectric constant of the capacitor.

SUMMARY OF THE INVENTION

In one aspect of the invention, a capacitor fabrication method may include forming a first capacitor electrode over a substrate and atomic layer depositing a conductive barrier layer to oxygen diffusion over the first electrode. A capacitor dielectric layer may be formed over the first electrode and a second capacitor electrode may be formed over the dielectric layer.

Another aspect of the invention may include chemisorbing a layer of a first precursor at least one monolayer thick over the first electrode and chemisorbing a layer of a second precursor at least one monolayer thick on the first precursor layer, a chemisorption product of the first and second precursor layers being comprised by a layer of a conductive barrier material.

Also, in another aspect of the invention a capacitor fabrication method may include forming a first capacitor electrode over a substrate. The first electrode can have an inner surface area per unit area and an outer surface area per unit area that are both greater than an outer surface area per unit area of the substrate. A capacitor dielectric layer may be formed over the first electrode and a second capacitor electrode may be formed over the dielectric layer.

A still further aspect includes a capacitor fabrication method of forming an opening in an insulative layer over a substrate, the opening having sides and a bottom, forming a layer of polysilicon over the sides and bottom of the opening, and removing the polysilicon layer from over the bottom of the opening. At least some of the polysilicon layer may be converted to hemispherical grain polysilicon. A first capacitor electrode may be conformally formed on the converted polysilicon, the first electrode being sufficiently thin that the first electrode has an outer surface area per unit area greater than an outer surface area per unit area of the substrate underlying the first electrode. A capacitor dielectric layer may be formed over the first electrode and a second capacitor electrode may be formed over the dielectric layer.

Other aspects of the invention include the capacitor constructions formed from the above described methods.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
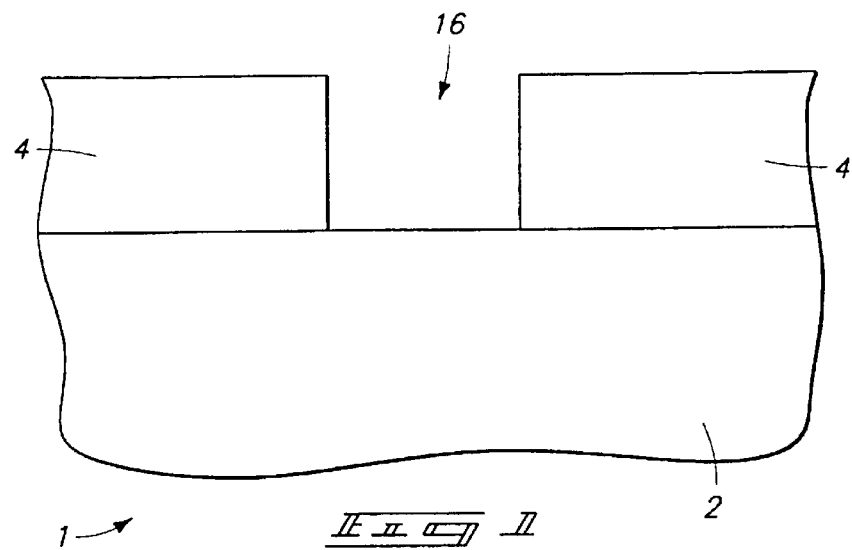
FIG. 1 is an enlarged view of a section of a semiconductor wafer at one processing step in accordance with the invention.

This disclosure of the invention is submitted in furtherance of the constitutional purposes of the U.S. Patent Laws "to promote the progress of science and useful arts" (Article 1, Section 8).

Atomic layer deposition (ALD) involves formation of successive atomic layers on a substrate. Such layers may comprise an epitaxial, polycrystalline, amorphous, etc. material. ALD may also be referred to as atomic layer epitaxy, atomic layer processing, etc. Further, the invention may encompass other deposition methods not traditionally referred to as ALD, for example, chemical vapor deposition (CVD), but nevertheless including the method steps described herein. The deposition methods herein may be described in the context of formation on a semiconductor wafer. However, the invention encompasses deposition on a variety of substrates besides semiconductor substrates.

In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Described in summary, ALD includes exposing an initial substrate to a first chemical species to accomplish chemisorption of the species onto the substrate. Theoretically, the chemisorption forms a monolayer that is uniformly one atom or molecule thick on the entire exposed initial substrate. In other words, a saturated monolayer. Practically, as further described below, chemisorption might not occur on all portions of the substrate. Nevertheless, such an imperfect monolayer is still a monolayer in the context of this document. In many applications, merely a substantially saturated monolayer may be suitable. A substantially saturated monolayer is one that will still yield a deposited layer exhibiting the quality and/or properties desired for such layer.

The first species is purged from over the substrate and a second chemical species is provided to chemisorb onto the first monolayer of the first species. The second species is then purged and the steps are repeated with exposure of the second species monolayer to the first species. In some cases, the two monolayers may be of the same species. Also, a third species or more may be successively chemisorbed and purged just as described for the first and second species.

Purging may involve a variety of techniques including, but not limited to, contacting the substrate and/or monolayer with a carrier gas and/or lowering pressure to below the deposition pressure to reduce the concentration of a species contacting the substrate and/or chemisorbed species. Examples of carrier gases include $N_2$, Ar, He, Kr, Ne, Xe, etc. Purging may instead include contacting the substrate and/or monolayer with any substance that allows chemisorption byproducts to desorb and reduces the concentration of a contacting species preparatory to introducing another species. A suitable amount of purging can be determined experimentally as known to those skilled in the art. Purging time may be successively reduced to a purge time that yields an increase in film growth rate. The increase in film growth rate might be an indication of a change to a non-ALD processing regime and may be used to establish a purge time limit.

ALD is often described as a self-limiting process, in that a finite number of sites exist on a substrate to which the first species may form chemical bonds. The second species might only bond to the first species and thus may also be self-limiting. Once all of the finite number of sites on a substrate are bonded with a first species, the first species will often not bond to other of the first species already bonded with the substrate. However, process conditions can be varied in ALD to promote such bonding and render ALD not self-limiting. Accordingly, ALD may also encompass a species forming other than one monolayer at a time by stacking of a species, forming a layer more than one atom or molecule thick. The various aspects of the present invention described herein are applicable to any circumstance where ALD may be desired.

Often, traditional ALD occurs within an often-used range of temperature and pressure and according to established purging criteria to achieve the desired formation of an overall ALD layer one monolayer at a time. Even so, ALD conditions can vary greatly depending on the particular precursors, layer composition, deposition equipment, and other factors according to criteria known by those skilled in the art. Maintaining the traditional conditions of temperature, pressure, and purging minimizes unwanted reactions that may impact monolayer formation and quality of the resulting overall ALD layer. Accordingly, operating outside the traditional temperature and pressure ranges may risk formation of defective monolayers.

The general technology of chemical vapor deposition (CVD) includes a variety of more specific processes, including, but not limited to, plasma enhanced CVD and others. CVD is commonly used to form non-selectively a complete, deposited material on a substrate. One characteristic of CVD is the simultaneous presence of multiple species in the deposition chamber that react to form the deposited material. Such condition is contrasted with the purging criteria for traditional ALD wherein a substrate is contacted with a single deposition species that chemisorbs to a substrate or previously deposited species. An ALD process regime may provide a simultaneously contacted plurality of species of a type or under conditions such that ALD chemisorption, rather than CVD reaction occurs. Instead of reacting together, the species may chemisorb to a substrate or previously deposited species, providing a surface onto which subsequent species may next chemisorb to form a complete layer of desired material. Under most CVD conditions, deposition occurs largely independent of the composition or surface properties of an underlying substrate. By contrast, chemisorption rate in ALD might be influenced by the composition, crystalline structure, and other properties of a substrate or chemisorbed species. Other process conditions, for example, pressure and temperature, may also influence chemisorption rate.

ALD, as well as other deposition methods and/or methods of forming conductive barrier layers may be useful in capacitor fabrication methods. According to one aspect of the invention, a capacitor fabrication method includes forming a first capacitor electrode over a substrate and atomic layer depositing a conductive barrier layer to oxygen diffusion over the first electrode. A capacitor dielectric layer may be formed over the first electrode and a second capacitor electrode may be formed over the dielectric layer. At least one of the first or second capacitor electrodes may comprise polysilicon, preferably hemispherical grain (HSG) polysilicon. The dielectric layer may comprise oxygen. Exemplary materials for the dielectric layer include, but are not limited to, $Ta_2O_5$, $ZrO_2$, $WO_3$, $Al_2O_3$, $HfO_2$, barium strontium titanate (BST), or strontium titanate (ST).

Notably, the conductive barrier layer to oxygen diffusion formed over the first electrode may provide the advantage of reducing oxidation of the electrode by oxygen diffusion from an oxygen source, for example, the dielectric layer. The dielectric layer may be formed over the barrier layer, thus, the barrier layer may reduce oxygen diffusion to the first capacitor electrode. Alternatively, such a barrier layer may reduce oxygen diffusion from the first capacitor electrode or under the first capacitor electrode to the dielectric layer or second capacitor electrode.

It follows then that the barrier layer may also be formed over the capacitor dielectric layer with the second capacitor electrode over the barrier layer such that the barrier layer reduces oxygen diffusion from the dielectric layer to the second electrode. Such positioning may also reduce oxygen diffusion from over the dielectric layer to the first capacitor electrode, for example, oxygen diffusion from the second capacitor electrode. Accordingly, one aspect of the invention may include atomic layer depositing the barrier layer over the first electrode, forming the dielectric layer over the barrier layer, and atomic layer depositing another conductive barrier to oxygen diffusion over the dielectric layer.

Prior to the atomic layer depositing, it may be advantageous to clean the deposition substrate, for example, the first electrode. Cleaning may be accomplished by a method comprising HF dip, HF vapor clean, or $NF_3$ remote plasma. Such cleaning methods may be performed in keeping with the knowledge of those skilled in the art. Likewise, forming the first and second electrodes and dielectric layer may be accomplished by methods known to those skilled in the art and may include atomic layer deposition, but preferably other methods.

The atomic layer depositing of the barrier layer may occur at a temperature of from about 100 to about 600° C. and at a pressure of from about 0.1 to about 10 Torr. The dielectric layer may exhibit a K factor of greater than about 7 at 20° C. Examples of suitable materials for the barrier layer include WN, WSiN, TaN, TiN, TiSiN, Pt, Pt alloys, Ir, Ir alloys, Pd, Pd alloys, $RuO_x$, or $IrO_x$, as well as other materials. The barrier layer may have a thickness of from about 50 to about 500 Angstroms or another thickness depending on the material properties.

One consideration in selecting a material for the barrier layer is the thickness and density of the barrier layer that will be sufficient to achieve a desired level of oxygen diffusion reduction. Another factor to evaluate is that the barrier layer might be considered to form a part of a capacitor electrode when the barrier layer contacts one of the first or second electrodes since the barrier layer is conductive. Accordingly, it may be advantageous to recalculate the desired dimensions of an electrode contacted by the barrier layer accounting for the presence of the additional conductive material. Accordingly, a "conductive" material as the term is used herein designates a material exhibiting a conductivity at 20° C. of greater than $10^{-12}$ microOhm$^{-1}$ centimeter$^{-1}$, or preferably greater than about $10^{-4}$ microOhm$^{-1}$ centimeter$^{-1}$. Notably, such definition expressly includes "semiconductive" material in the range of about $10^{-12}$ to about $10^{-4}$ microOhm$^{-1}$ centimeter$^{-1}$. As an alternative, a "conductive" material in the present context might be viewed as a material that does not substantially impact the capacitance otherwise achieved without the material. Generally, an "insulative" material might produce a change in capacitance as such a barrier layer.

As another aspect of the present invention a capacitor fabrication method may include forming a first capacitor electrode over a substrate, chemisorbing a layer of a first precursor at least one monolayer thick over the first electrode, and chemisorbing a layer of a second precursor at least one monolayer thick on the first precursor layer. A chemisorption product of the first and second precursor layers may be comprised by a layer of a conductive barrier material. Because the chemisorption product is comprised by the barrier layer, the barrier layer may also include conductive barrier material that is not a chemisorption product of the first and second precursor layers. A capacitor dielectric layer may be formed over the first electrode and a second capacitor electrode may be formed over the dielectric layer. The various positions for the barrier layer discussed above are also applicable to the present aspect of the invention.

In forming the chemisorption product of the first and second precursor layers, the first and second precursor layers may each consist essentially of a monolayer. Further, the first and second precursor layers may each comprise substantially saturated monolayers. The extent of saturation might not be complete and yet the barrier layer will nevertheless provide the desired properties. Thus, substantially saturated may be adequate. The first and second precursor may each consist essentially of only one chemical species. However, as described above, precursors may also comprise more than one chemical species. Preferably, the first precursor is different from the second precursor, although for some barrier layers, the first and second precursor will be the same. Examples of pairs of first and second precursors include: $WF_6/NH_3$, $TaCl_5/NH_3$, $TiCl_4/NH_3$, tetrakis (dimethylamido)titanium/$NH_3$, ruthenium cyclopentadiene/ $H_2O$, $IrF_5/H_2O$, organometallic Pt/$H_2O$. It is conceivable that more than one of the preceding pairs may comprise the first and second precursors, but preferably only one of the pairs. Additional alternating first and second precursor layers may be chemisorbed in keeping with the above aspect of the invention to achieve a desired thickness for the barrier layer.

Although ALD and/or chemisorbing first and second precursors may be suitable for forming a barrier layer, other methods may also be suitable. Accordingly, a variety of barrier layer forming techniques may be used in combination with techniques to increase electrode surface area to provide enhancement of capacitance per unit area.

In another aspect of the invention, a capacitor fabrication method can include forming a first capacitor electrode over a substrate where the first electrode has an inner surface area per unit area and an outer surface area per unit area that are both greater than an outer surface area per unit area of the substrate. One example of obtaining the inner and outer electrode surface areas involves further forming rugged polysilicon over the substrate and forming the first electrode over the rugged polysilicon. The first electrode can also be formed on the rugged polysilicon. The rugged polysilicon can have a surface area per unit area greater than the surface area per unit area of conventionally formed polysilicon that is not converted to rugged polysilicon. A capacitor dielectric layer and a second capacitor electrode may be formed over the first electrode to produce a capacitor construction.

The first electrode can comprise TiN, as well as other materials, and may be deposited by ALD, CVD, and perhaps other methods. The rugged polysilicon can be HSG polysilicon and it can also be undoped. Thus, in the present aspect a first electrode may be formed having an outer surface area at least 30% greater the substrate outer surface area. Advantageously, the first electrode need not comprise polysilicon to accomplish the surface area enhancement. Further, it is conceivable that the first electrode can be formed over materials other than rugged polysilicon that provide enhanced surface area compared to the substrate underlying the first electrode.

To achieve more preferred first electrode surface area, rugged polysilicon may be formed using a seed density sufficiently small to yield at least some spaced apart grains. Thus, forming subsequent layers of the capacitor does not fill the space between grains so much as to reduce the capacitance enhancement possible with the first electrode of increased surface area. Conventionally, HSG is formed to optimize surface area with very closely positioned grains since a capacitor electrode will consist of the HSG. In the present aspect of the invention, less closely positioned grains may be formed than would provide optimal surface area for rugged or HSG polysilicon since the first electrode can be formed on the polysilicon rather than consist of the polysilicon. The less closely position grains of the invention will provide a greater outer surface area for the first electrode compared to what HSG optimized for surface area would provide to a first electrode formed on optimized HSG. Also, undoped grains of rugged polysilicon may provide the advantage of grain size being smaller than for doped grains such that a smaller capacitor container may be used.

Figure 2:
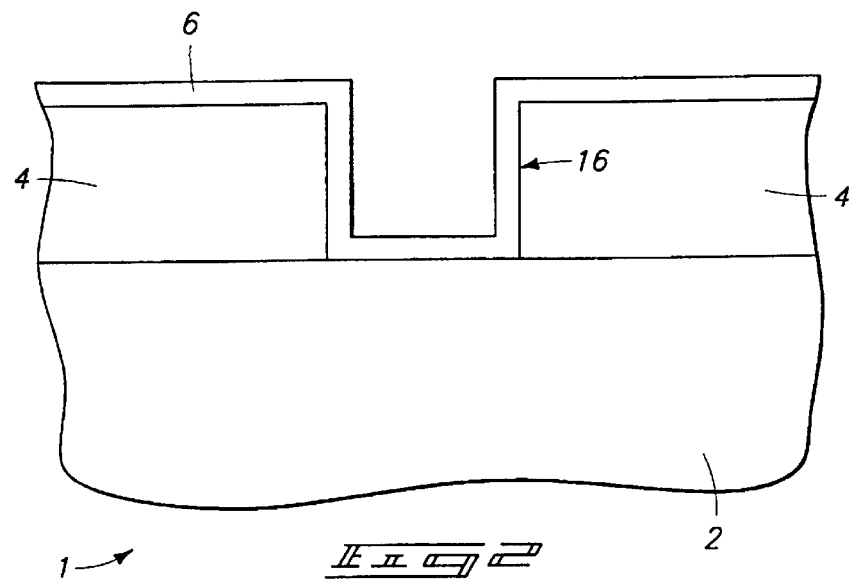
FIG. 2 is an enlarged view of the section of the FIG. 1 wafer at a processing step subsequent to that depicted by FIG. 1.
Figure 3:
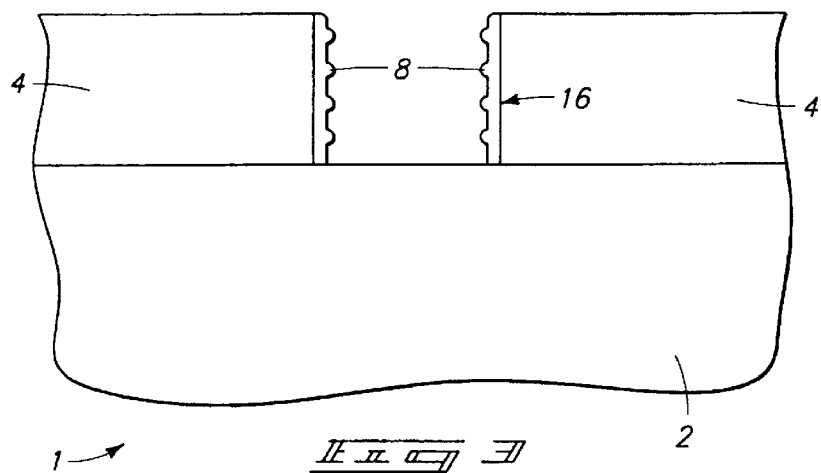
FIG. 3 is an enlarged view of the section of the FIG. 1 wafer at a processing step subsequent to that depicted by FIG. 2.

FIGS. 1–6 exemplify the features of the various aspects of the invention described above, as well as other aspects of the invention. For example, according to another aspect of the invention, FIG. 1 shows wafer portion 1 including a substrate 2 with an insulative layer 4 formed thereon. A capacitor fabrication method may include forming an opening 16 in insulative layer 4, the opening 16 having sides and a bottom. Although not shown, the opening may expose an electrical contact in substrate 2 for subsequent electrical linking with a capacitor electrode. Turning to FIG. 2, a layer of polysilicon 6 may be formed over the sides and bottom of the opening. Polysilicon layer 6 may then be removed from over the bottom of opening 16 and converted by low density seeding to an undoped rugged layer 8 comprising HSG polysilicon, as shown in FIG. 3. An anisotropic spacer etch may be used to remove polysilicon, preferably before conversion, from over the bottom of the opening while leaving polysilicon over the sides. Accordingly, no undoped polysilicon will exist between an electrical contact, such as a polysilicon or metal plug, in substrate 2 and a bottom capacitor electrode. If polysilicon is present at the bottom, it may cause high contact resistance or an open between the bottom electrode and the contact.

Figure 4:
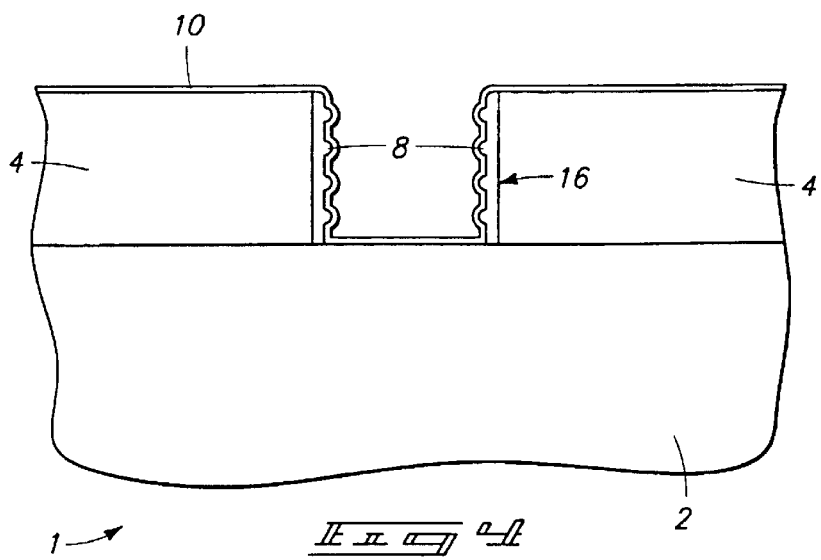
FIG. 4 is an enlarged view of the section of the FIG. 1 wafer at a processing step subsequent to that depicted by FIG. 3.
Figure 5:
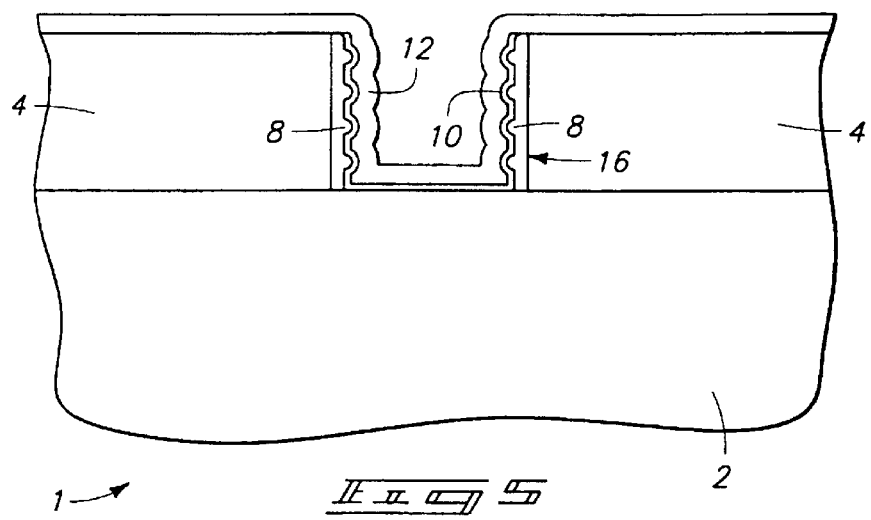
FIG. 5 is an enlarged view of the section of the FIG. 1 wafer at a processing step subsequent to that depicted by FIG. 4.
Figure 6:
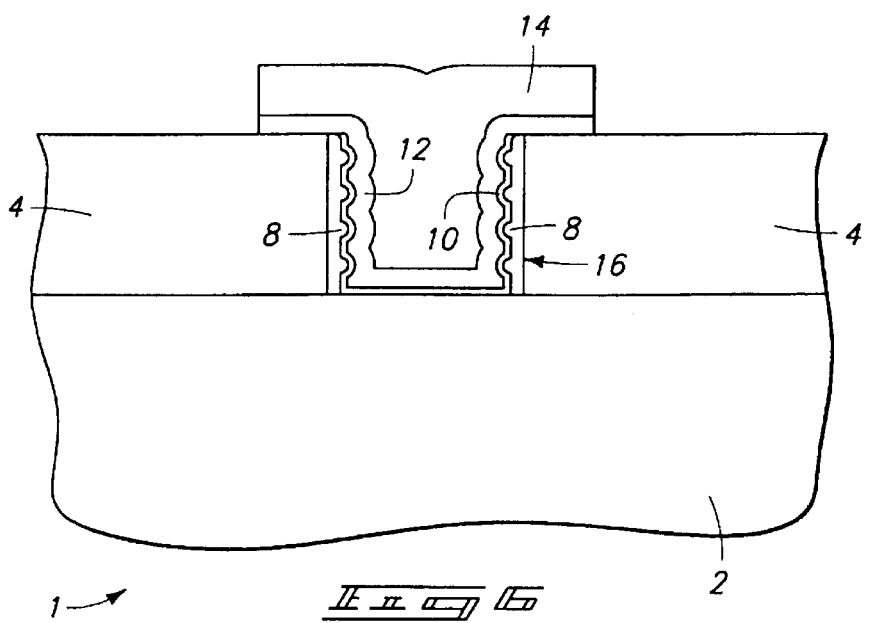
FIG. 6 is an enlarged view of the section of the FIG. 1 wafer at a processing step subsequent to that depicted by FIG. 5.

In FIG. 4, a first capacitor electrode 10 may be conformally formed on undoped polysilicon 8. First electrode 10 may be sufficiently thin that it has an outer surface area per unit area greater than an outer surface area per unit area of the portion of substrate 2 underlying first electrode 10. For example, first electrode 10 may have a thickness of from about 50 to about 500 Angstroms, preferably about 200 Angstroms. A capacitor dielectric layer 12 may be formed on first electrode 10 as shown in FIG. 5. FIG. 6 shows excess portions of dielectric layer 12 and a subsequently formed second capacitor electrode layer 14 removed from over insulative layer 4 to produce a capacitor construction.

Advantageously, first electrode 10 has an enhanced surface area yet might not produce a $SiO_2$ interfacial dielectric with an oxygen containing dielectric layer since first electrode 10 may comprise materials other than polysilicon, for example, TiN. Accordingly, the benefits of high K dielectrics, such as $Ta_2O_5$, may be maximized while still providing enhanced electrode surface area.

Figure 7:
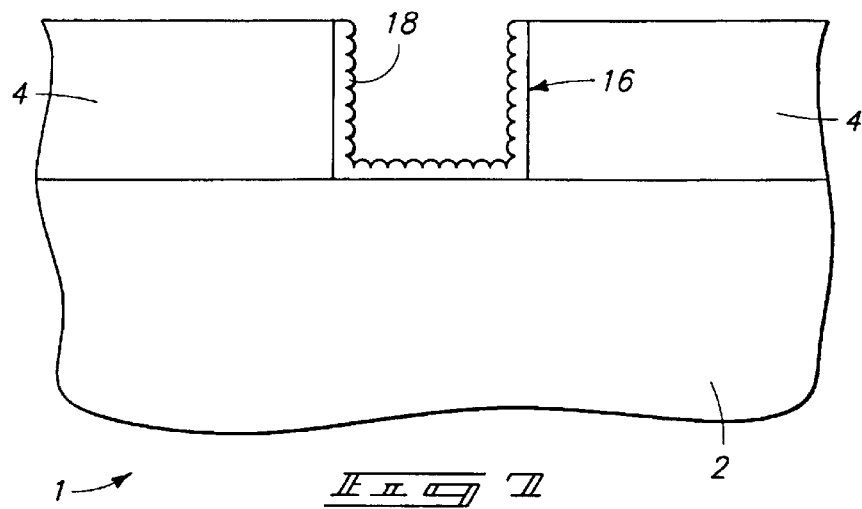
FIG. 7 is an enlarged view of the section of the FIG. 1 wafer at an alternate embodiment processing step subsequent to that depicted by FIG. 2 in accordance with alternate aspects of the invention.

FIGS. 7–10 exemplify the features of the various aspects of the invention described above pertaining to barrier layers, as well as other aspects of the invention, according to an alternative process flow. For example, FIG. 7 shows wafer portion 1 of FIG. 2 including a substrate 2 with insulative layer 4, opening 16 in insulative layer 4, and polysilicon layer 6 converted to a first capacitor electrode 18 comprising doped HSG polysilicon.

Figure 8:
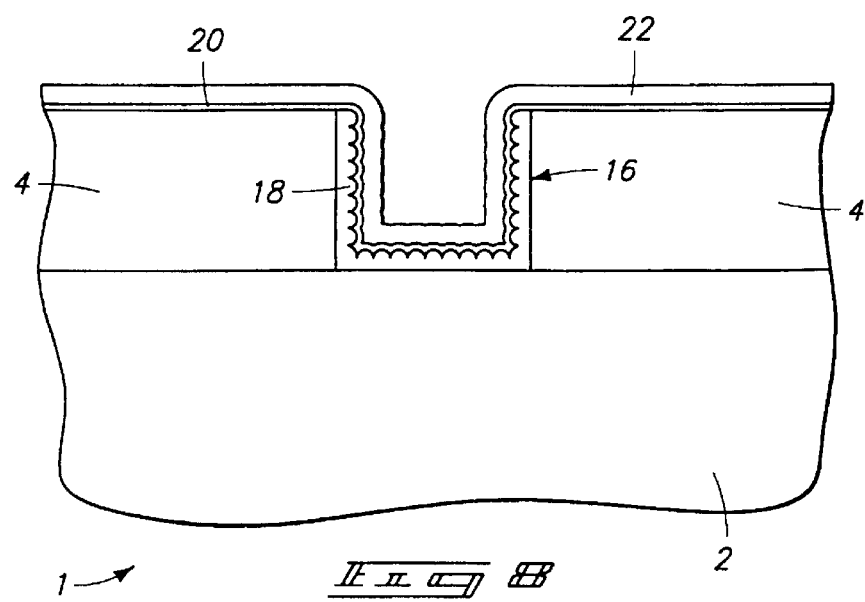
FIG. 8 is an enlarged view of the section of the FIG. 1 wafer at a processing step subsequent to that depicted by FIG. 7.
Figure 9:
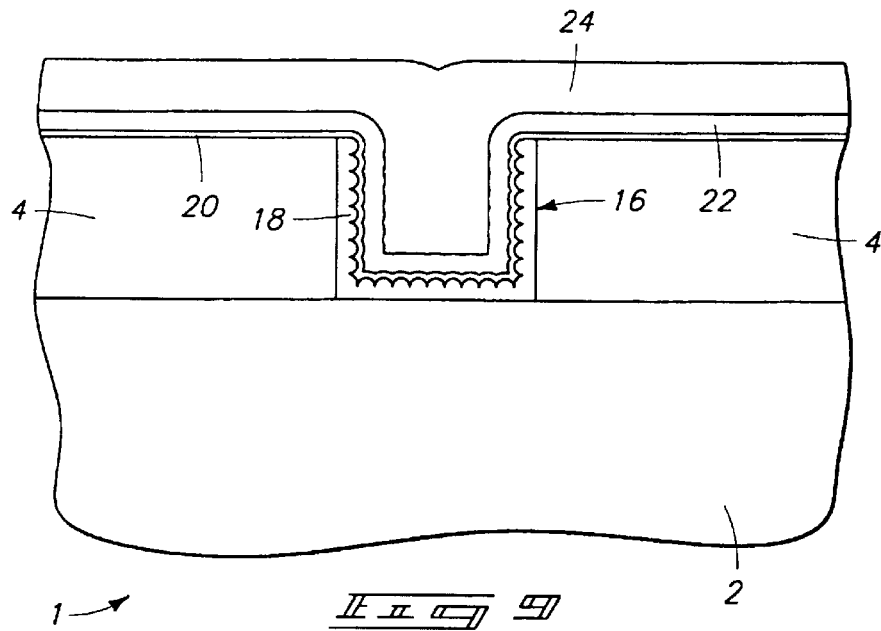
FIG. 9 is an enlarged view of the section of the FIG. 1 wafer at a processing step subsequent to that depicted by FIG. 8.
Figure 10:
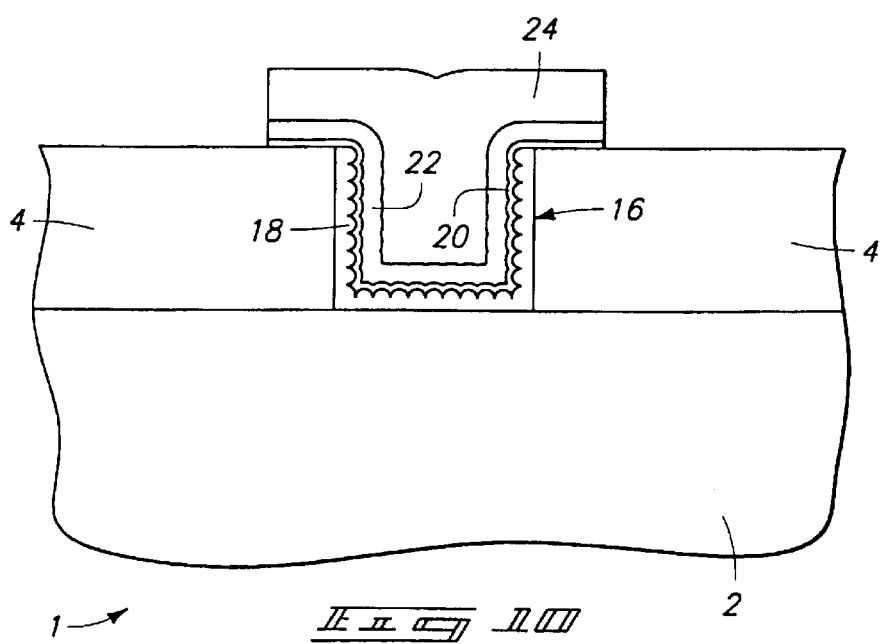
FIG. 10 is an enlarged view of the section of the FIG. 1 wafer at a processing step subsequent to that depicted by FIG. 9.

In FIG. 8, a conductive barrier layer 20 may be conformally formed on first electrode 18 by, for example, ALD. A capacitor dielectric layer 22 may be formed on barrier layer 20. The barrier layer may be sufficiently thick and dense to reduce oxidation of electrode 18 by oxygen diffusion from over the barrier layer. One source of oxygen diffusion may be dielectric layer 22. FIG. 9 shows formation of a second capacitor electrode 24 on dielectric layer 22. FIG. 10 shows excess portions of barrier layer 20, dielectric layer 22, and second electrode layer 24 removed from over insulative layer 4 to form a capacitor construction. As described above, a barrier layer may also be formed over a dielectric layer although not shown in the Figures.

In a still further alternative aspect of the invention, barrier layer 20 may be removed from over insulative layer 4 prior to forming dielectric layer 22. Chemical mechanical polishing is one example of a suitable removal method for excess portions of barrier layer 20. However, such an alternative is less preferred since the portion of first electrode 18 planar with insulative layer 4 might be exposed during polishing and may contact dielectric layer 22. At the point of contact, an $SiO_2$ interfacial dielectric may form if first electrode 18 includes silicon and dielectric layer 22 includes oxygen.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A capacitor fabrication method comprising:
   forming a first capacitor electrode over a substrate;
   atomic layer depositing a conductive barrier layer to oxygen diffusion on and in physical contact with the first electrode, the barrier layer containing WN;
   forming a capacitor dielectric layer on and in physical contact with the barrier layer; and
   forming a second capacitor electrode over the dielectric layer.

2. The method of claim 1 wherein the atomic layer depositing occurs at a temperature of from about 100 to about 600° C. and at a pressure of from about 0.1 to about 10 Torr.

3. The method of claim 1 wherein the atomic layer deposited barrier layer has a thickness of from about 50 to about 500 Angstroms.

4. The method of claim 1 wherein the dielectric layer exhibits a K factor of greater than about 7 at 20° C.

5. The method of claim 1 wherein at least one of the first or second electrodes comprise polysilicon and the dielectric layer comprises oxygen.

6. The method of claim 1 wherein the dielectric layer comprises $Ta_2O_5$, $ZrO_2$, $WO_3$, $Al_2O_3$, $HfO_2$, barium strontium titanate, or strontium titanate.

7. The method of claim 1 further comprising atomic layer depositing another conductive barrier layer to oxygen diffusion over the dielectric layer.

8. The method of claim 1 wherein the forming the electrodes and the dielectric layer occur by other than atomic layer deposition.

9. The method of claim 1 further comprising cleaning the first electrode prior to the atomic layer depositing by a method comprising HF dip, HF vapor clean, or $NF_3$ remote plasma.

10. A capacitor fabrication method comprising:
forming a first capacitor electrode over a substrate;
chemisorbing a layer of a first precursor at least one monolayer thick on and in physical contact with the first electrode;
chemisorbing a layer of a second precursor at least one monolayer thick on the first precursor layer, a chemisorption product of the first and second precursor layers being comprised by a layer of a conductive barrier material containing WN;
forming a capacitor dielectric layer on and in physical contact with the barrier layer; and
forming a second capacitor electrode over the dielectric layer.

11. The method of claim 10 wherein the first and second precursor layers each consist essentially of a monolayer.

12. The method of claim 10 wherein the first and second precursor layers each comprise substantially saturated monolayers.

13. The method of claim 10 wherein the first and second precursor each consist essentially of only one chemical species.

14. The method of claim 10 wherein the first precursor is different from the second precursor.

15. The method of claim 10 wherein the first and second precursors respectively comprise.

16. The method of claim 10 wherein the dielectric layer is over the barrier layer, further comprising chemisorbing additional alternating first and second precursor layers before forming the dielectric layer.

17. The method of claim 16 wherein the barrier layer has a thickness and a density effective to reduce oxidation of the first electrode by oxygen from over the barrier layer.

18. The method of claim 16 wherein the barrier layer has a thickness of from about 50 to about 500 Angstroms.

19. The method of claim 10 wherein the dielectric layer exhibits a K factor of greater than about 7 at 20° C.

20. The method of claim 10 wherein at least one of the first or second electrodes comprises silicon and the dielectric layer comprises oxygen.

21. The method of claim 10 wherein the dielectric layer comprises $Ta_2O_5$, $ZrO_2$, $WO_3$, $Al_2O_3$, $HfO_2$, barium strontium titanate, or strontium titanate.

22. A capacitor fabrication method comprising:
forming a first capacitor electrode over a substrate, the first electrode containing HSG polysilicon;
atomic layer depositing a first metal-containing conductive layer on and in pysical conatct with the first electrode as a barrier to oxygen diffusion;
forming a capacitor dielectric layer containing oxygen on and in physical contact with the atomic layer deposited first conductive layer;
atomic layer depositing a second metal-containing conductive layer over the dielectric layer as a barrier to oxygen diffusion; and
forming a second capacitor electrode over the second conductive layer.

23. The method of claim 22 wherein the atomic layer deposited conductive layers comprise elemental metal, a metal alloy, a metal containing compound.

24. The method of claim 22 wherein the atomic layer deposited conductive layers comprise WN, WSiN, TaN, TiN, TiSiN, Pt, Pt alloys, Ir, Ir alloys, Pd, Pd alloys, $RuO_x$, or $IrO_x$.

25. The method of claim 22 wherein the dielectric layer comprises $Ta_2O_5$, $ZrO_2$, $WO_3$, $Al_2O_3$, $HfO_2$, barium strontium titanate, or strontium titanate.

26. A capacitor fabrication method comprising:
forming a first capacitor electrode over a substrate, the first electrode containing HSG polysilicon;
chemisorbing a layer of a first precursor at least one monolayer thick on and in physical contact with the first electrode;
chemisorbing a layer of a second precursor at least one monolayer thick on the first precursor layer, a chemisorption product of the first and second precursor layers being comprised by a first layer of a metal-containing conductive material as a barrier to oxygen diffusion;
forming a capacitor diectric layer containing oxygen on and in physical contact with the first conductive layer;
chemisorbing a layer of the first precursor at least one monolayer thick over the dielectric layer;
chemisorbing a layer of the second precursor at least one monolayer thick on the first precursor layer over the dielectric layer, a chemisorption product of the first and second precursor layers being comprised by a second layer of a metal-containing conductive material as a barrier to oxygen diffusion; and
forming a second capacitor electrode over the second conductive layer.

27. The method of claim 26 wherein the first and second precursor layers each consist essentially of a monolayer.

28. The method of claim 26 wherein the first and second precursors respectively comprise only one of the following pairs: $WF_6/NH_3$, $TaCl_5/NH_3$, $TiCl_4/NH_3$, tetrakis (dimethylamido)titanium/$NH_3$, ruthenium cyclopentadiene/$H_2O$, $IrF_5/H_2O$, organometallic Pt/$H_2O$.

29. The method of claim 26, wherein the conductive layers comprise elemental metal, a metal alloy, or a metal containing compound.

30. The method of claim 26 wherein the conductive material comprises WN, WSiN, TaN, TiN, TiSiN, Pt, Pt alloys, Ir, Ir alloys, Pd, Pd alloys, $RuO_x$, or $IrO_x$.

31. The method of claim 26 wherein the dielectric layer comprises $Ta_2O_5$, $ZrO_2$, $WO_3$, $Al_2O_3$, $HfO_2$, barium strontium titanate, or strontium titanate.

32. The method of claim 1 wherein the substrate comprises a semiconductive wafer.

33. The method of claim 1 wherein the first capacitor electrode comprises HSG polysilicon.

34. The method of claim 1 wherein the capacitor dielectric layer comprises $Al_2O_3$.

35. The method of claim 1 wherein the second capacitor electrode comprises TiN.

36. The method of claim 1 wherein the first capacitor electrode comprises HSG polysilicon, the capacitor dielectric layer comprises $Al_2O_3$, and the second capacitor electrode comprises TiN.

37. The method of claim 10 wherein the substrate comprises a semiconductive wafer.

38. The method of claim 10 wherein the first capacitor electrode comprises HSG polysilicon.

39. The method of claim 10 wherein the capacitor dielectric layer comprises $Al_2O_3$.

40. The method of claim 10 wherein the second capacitor electrode comprises TiN.

41. The method of claim 10 wherein the first capacitor electrode comprises HSG polysilicon, the capacitor dielectric layer comprises $Al_2O_3$, and the second capacitor electrode comprises TiN.

42. The method of claim 22 wherein the substrate comprises a semiconductive wafer.

43. The method of claim 22 wherein the atomic layer deposited first conductive layer comprises TiN.

44. The method of claim 22 wherein the capacitor dielectric layer comprises $Al_2O_3$.

45. The method of claim 22 wherein the second capacitor electrode comprises TiN.

46. The method of claim 22 wherein the first atomic layer deposited conductive layer comprises TiN, the capacitor dielectric layer comprises $Al_2O_3$, and the second atomic layer deposited conductive layer comprises TiN.

47. The method of claim 26 wherein the substrate comprises a semiconductive wafer.

48. The method of claim 26 wherein the first conductive layer comprises TiN.

49. The method of claim 26 wherein the capacitor dielectric layer comprises $Al_2O_3$.

50. The method of claim 26 wherein the second capacitor electrode comprises TiN.

51. The method of claim 26 wherein the first conductive layer comprises TiN, the capacitor dielectric layer comprises $Al_2O_3$, and the second conductive layer comprises TiN.

* * * * *

UNITED STATES PATENT AND TRADEMARK OFFICE
CERTIFICATE OF CORRECTION

| | | |
|---|---|---|
| PATENT NO. | : 7,217,615 B1 | Page 1 of 1 |
| APPLICATION NO. | : 09/653149 | |
| DATED | : May 15, 2007 | |
| INVENTOR(S) | : Derderian et al. | |

It is certified that error appears in the above-identified patent and that said Letters Patent is hereby corrected as shown below:

On the face page, in field (56), under "Other Publications", in column 2, line 2, delete "Nov. 12, 2001" and insert -- Aug. 27, 1998 --, therefor.

In column 8, line 48, in Claim 3, delete "50" and insert -- 200 --, therefor.

In column 9, line 25, in Claim 15, delete "comprise." and insert -- comprise $WF_6/NH_3$. --, therefor.

In column 9, lines 26-27, in Claim 16, after "claim 10" delete "wherein the dielectric layer is over the barrier layer,".

In column 9, line 34, in Claim 18, delete "50" and insert -- 200 --, therefor.

In column 9, line 48, in Claim 22, delete "pysical conatct" and insert -- physical contact --, therefor.

In column 9, line 60, in Claim 23, delete "a metal containing" and insert -- or a metal-containing --, therefor.

In column 10, line 13, in Claim 26, delete "diectric" and insert -- dielectric --, therefor.

In column 10, line 40, in Claim 31, delete "Z $rO_2$," and insert -- $ZrO_2$, --, therefor.

In column 10, line 40, in Claim 31, delete "$Al_2O_3$," and insert -- $Al_2O_3$, --, therefor.

Signed and Sealed this

Twentieth Day of November, 2007

JON W. DUDAS
*Director of the United States Patent and Trademark Office*